United States Patent [19]

Matsuoka et al.

[11] Patent Number: 5,277,594
[45] Date of Patent: Jan. 11, 1994

[54] CONNECTOR

[75] Inventors: Noriyuki Matsuoka, Yokohama; Michael K. Pierson, Tokyo, both of Japan

[73] Assignee: Yamaichi Electronics Co., Ltd., Tokyo, Japan

[21] Appl. No.: 999,143

[22] Filed: Dec. 31, 1992

[30] Foreign Application Priority Data

Mar. 10, 1992 [JP] Japan .................. 4-087639

[51] Int. Cl.⁵ .............................................. H01R 9/09
[52] U.S. Cl. ..................................... 439/172; 439/73; 439/331
[58] Field of Search ........................ 439/70; 73, 8, 82, 330, 331, 525, 526

[56] References Cited

U.S. PATENT DOCUMENTS

| | | |
|---|---|---|
| 4,547,031 | 10/1985 | Korsunsky ............ 439/331 |
| 4,688,870 | 8/1987 | Egawa et al. ............ 439/331 |
| 4,746,299 | 5/1988 | Matsuoka et al. ............ 439/70 |
| 4,846,702 | 7/1989 | Ignasiak et al. ............ 439/72 |
| 4,984,991 | 1/1991 | Nishimoto ............ 439/72 |
| 5,100,332 | 3/1992 | Egawa ............ 439/331 |
| 5,192,215 | 3/1993 | Grabbe et al. ............ 439/73 |

Primary Examiner—Paula A. Bradley
Attorney, Agent, or Firm—Wenderoth Lind & Ponack

[57] ABSTRACT

An elastic pressure member is disposed between adjacent first elastic contacts arranged on a base member such that the elastic pressure member corresponds to second contacts arranged on a cover member. Parts of the plurality of leads arranged on an electric part are given contact pressure by elasticity of the first contacts, and the remainder of the leads are given contact pressure against the second contacts by elasticity of the elastic pressure member.

4 Claims, 7 Drawing Sheets

CONNECTOR

BACKGROUND OF THE INVENTION

1. Field of the Invention

This invention relates generally to a connector, and more particularly to a connector having a base member provided with contacts and a cover member likewise provided with contacts, the contacts on the base member and cover member being capable of contacting mutually different leads arranged on an electric part, wherein both the contacts on the base member and cover member can be contacted with the leads in a positive manner.

2. Prior Art

There has been known a connector having a contact structure for contacting IC contacts from opposite sides, having a base member constituting a connector body, and a cover member, the cover member being closed onto the base member after an IC is placed on the latter, so that contact relation can be maintained while holding the IC, wherein contacts are separately arranged on the base member and cover member in order to cope with a known requirement for a very small pitch arrangement of the leads of an IC, thereby enabling the contacts on both the base member and cover member to be alternately contacted with upper surfaces and under surfaces of the leads when the cover member is closed onto the base member.

In the above connector, the contacts on both the base member and cover member are provided with elasticity in order to obtain contact pressure against the leads.

By virtue of the arrangement that the contacts are alternately arranged on the base member and cover member, the above connector has the advantages that while the contact pitches on both the base member and cover member are large, the requirement for a very small pitch arrangement of the leads is satisfied. However, this conventional connector has the problem that the leads tend to be deformed. This problem will be described with reference to a conceptual view shown in FIG. 11. When the cover member 2 is closed on the base member 1, the leads 5 are urged against the elastic contacts 3 on the base member 1 by the cover member 2. Then, the leads 5 are flexed downwardly while compressing the contacts 3. On the other hand, the leads 6, which are urged against the elastic contacts 4 on the cover member 2, are flexed upwardly while compressing the contacts 4. Since reverse bending forces are applied to the leads 5, 6, the leads 5, 6 are subjected to a thermal test, etc. in that state. As a result, the leads 5, 6 are incapable of returning to their original states even after the pressure is removed. This means that the leads 5, 6 suffer from so-called "permanent deformation", which also causes vertical irregular arrangement of the leads, thus jeopardizing flatness. In recent years, leads of IC, etc. have been formed smaller and smaller, and they are becoming more and more fragile. Therefore, it is indispensable to obviate the above-mentioned problems.

SUMMARY OF THE INVENTION

It is therefore an object of the present invention to provide a connector in which contacts on a base member are capable of being contacted with contacts on a cover member in a wholesome manner.

To achieve the above objects, in one aspect of the present invention, there is essentially provided a connector comprising a base member provided with a plurality of first contacts adapted to be contacted with under surfaces of corresponding leads of an electric part, and a cover member to be closed onto the base member, provided with a plurality of second contacts adapted to be contacted with upper surfaces of corresponding the leads, the first and second contacts being contacted with mutually different the leads of the electric part when the electric part is inserted between the base member and the cover, wherein the first contacts on the base member are provided with elasticity for obtaining contact pressure against the under surfaces of the leads, an elastic pressure member being disposed between adjacent first contacts in such a manner as to correspond to the second contacts so that the under surfaces of the leads are pushed up by the elastic pressure member to obtain contact pressure between the second contacts and the upper surfaces of the leads.

In another aspect of the invention, there is provided a connector comprising a base member provided with a plurality of first contacts adapted to be contacted with under surfaces of corresponding leads of an electric part, and a cover member to be closed onto the base member, provided with a plurality of second contacts adapted to be contacted with upper surfaces of corresponding the leads, the first and second contacts being contacted with mutually different leads of the electric part when the electric part is inserted between the base member and the cover, wherein the second contacts are provided with elasticity for obtaining contact pressure against the upper surfaces of the leads, an elastic pressure member being disposed between adjacent second contacts in such a manner as to correspond to the first contacts so that the upper surfaces of the leads are pushed down by the elastic pressure member to obtain contact pressure between the first contacts and the lower surfaces of the leads.

DETAILED DESCRIPTION OF THE EMBODIMENT

Figure 1:
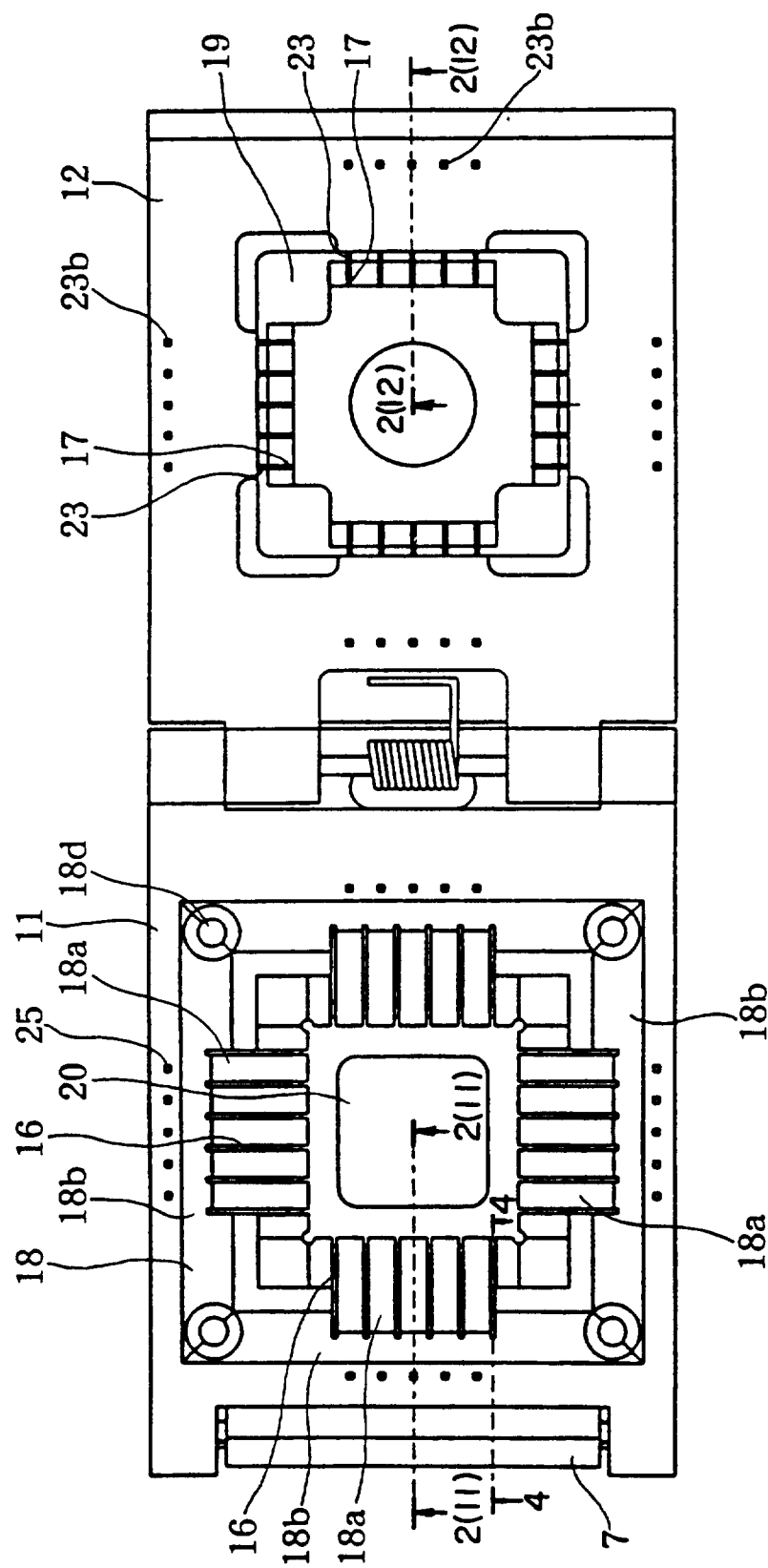
FIG. 1 is a plan view of a connector according to one embodiment of the present invention, showing a state where a cover member thereof is opened.
Figure 2:
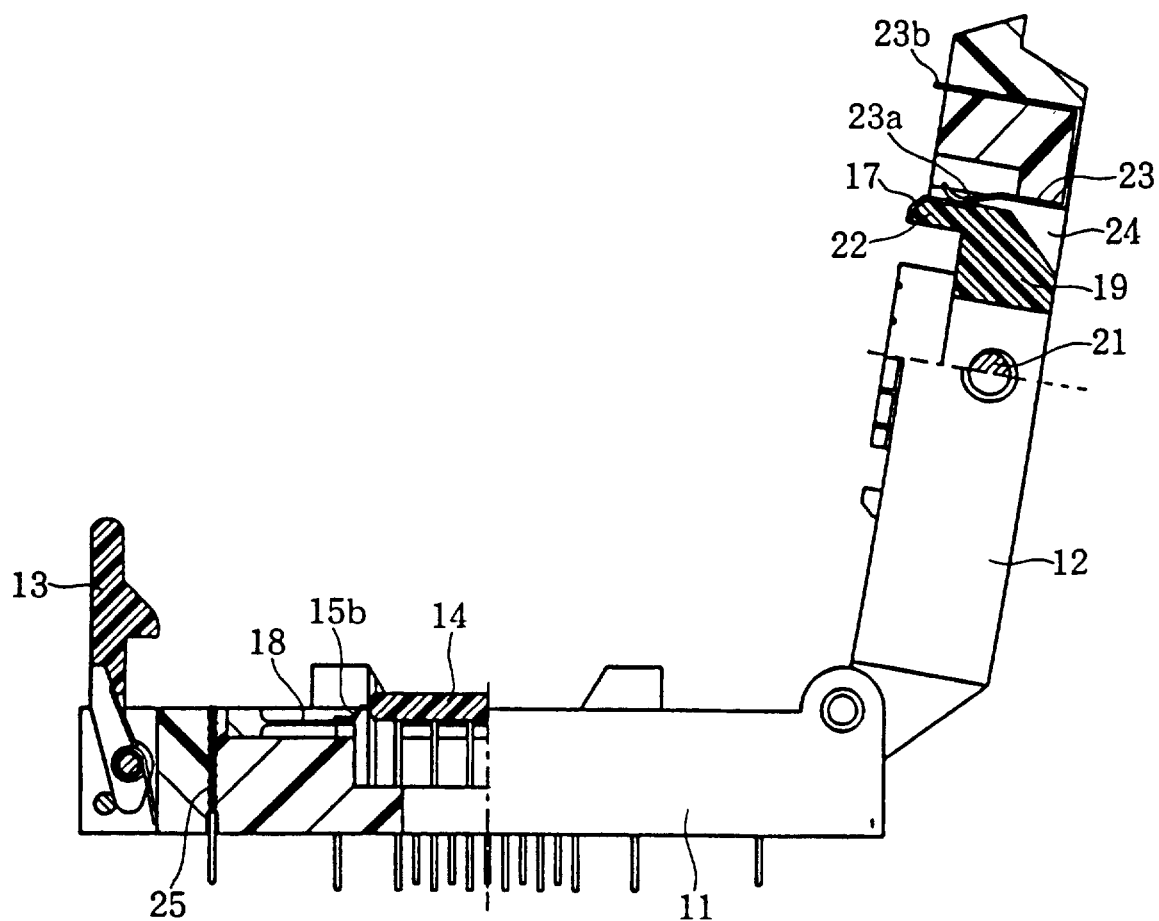
FIG. 2 is an elevation view having a base member partly in section taken on line 2(11)—2(11) of FIG. 1 and an open cover member partly in section taken on line 2(12)—2(12) in FIG. 1.

One embodiment of a connector according to the present invention will now be described with reference to FIGS. 1 through 10 inclusive.

In FIGS. 1 through 5, the numeral 11 denotes a base member formed of an insulating material, constituting a connector main body, and 12, a cover member to be closed onto the base member 11, respectively. The cover member 12 is pivotably supported on one end of the base member 11, and a lock lever 13 pivotably supported on the other end of the base member is engaged with a free end of the cover member 12 to maintain a closed state of the cover member, in which state an electric part is held between the base member 11 and the cover member 12 in order to maintain the contacting state of leads of the electric part. The numeral 14 denotes an electric part as represented by an IC. The IC 14 has a number of leads 15a, 15b projecting sideward in an orderly manner, preferably alternately, from two sides or four sides of its main body. On the other hand, the base member 11 is provided with first contacts 16 arranged thereon in such a manner as to correspond to the leads 15a, along two sides or four sides around a mounting section 20 which is formed at a central area thereof, while the cover member 12 is provided with second contacts 17 corresponding to the leads 15b. The arrangement is such that, as illustrated for example, the first contacts 16 are capable of contacting under surfaces of every other lead, namely leads 15a respectively, and the second contacts 17 are likewise capable of contacting upper surfaces of the remaining every other lead, namely leads 15b respectively. In other words, the first contacts 16 are implanted in the base member 11, while the second contacts 17 are implanted in the cover member 12 at mutually shifted pitches which are twice the pitches of the leads respectively.

Figure 4:
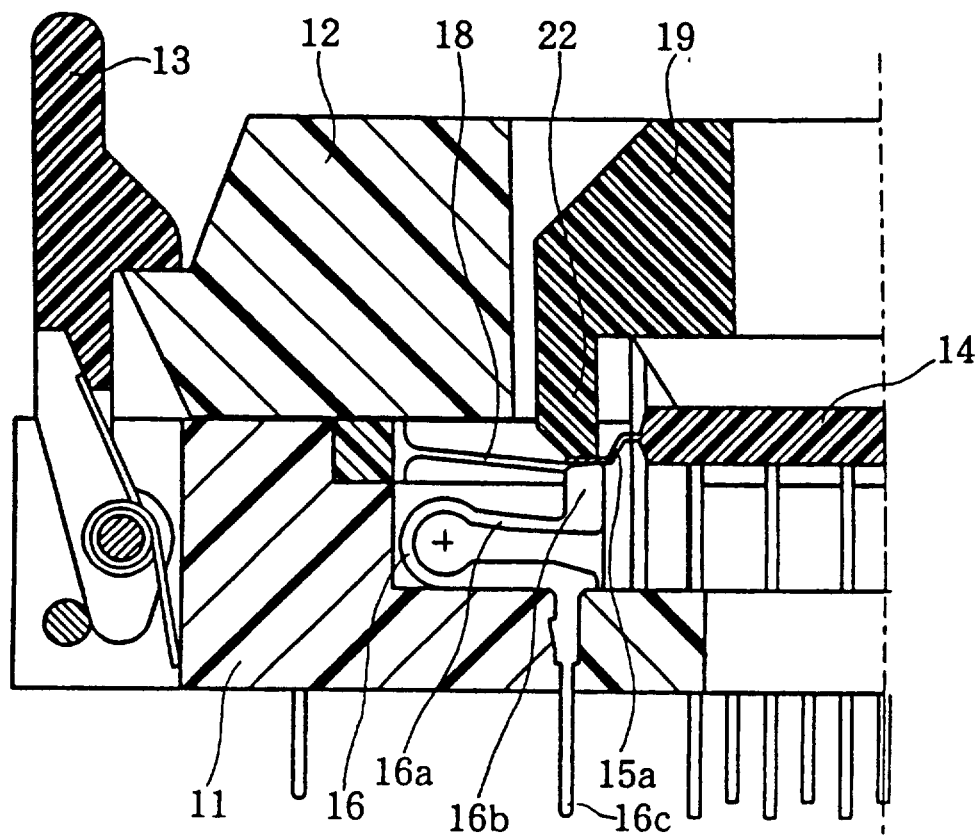
FIG. 4 is a sectional view taken on line 4—4 of FIG. 1, showing a state where a cover member thereof is closed.

In the illustrated example, the first and second contacts 16 and 17 are arranged such that they are capable of contacting those leads which are in every other position. The arrangement may be changed such that the first and second contacts 16 and 17 are capable of contacting leads at two positional intervals, or three positional intervals, or positional intervals of an even greater number. Each of the first contacts 16, as shown in FIG. 4, has a spring portion 16a capable of being elastically flexed upward and downward, and a projection 16b formed at one end of the spring portion 16a and defining a contact nose portion. The under surface of each lead 15a is pressed on the projection 16b so as to cause the spring portion 16a to be flexed downward to obtain contact pressure by reaction thereof. On the other hand, the second contacts 17 formed on the cover member 12 are of rigid structure, respectively, without having elasticity as in the first contacts, and are capable of contacting the upper surfaces of the leads 15b, respectively. An elastic pressure member 18 corresponding to the second contacts 17 is interposed between each pair of adjacent first contacts 16. The upper surfaces of the leads 15b are pressed by the non-elastic second contacts 17 so as to cause the elastic pressure member 18, which is in contact with the under surfaces of the leads 15b, to be flexed downwardly against the elasticity thereof, in order to obtain contact pressure by reaction thereof.

The second contacts 17 are mounted directly on the cover member 12. Alternatively, as shown in FIGS. 1 through 4, a lead pressure member 19 corresponding to the electric part mounting section 20 is built in the central portion of the cover member 12, a generally central portion of the pressure member 19 is supported by a shaft 21 such that the pressure member 19 is capable of pivoting vertically with respect to the cover member 12. Pressure pads 22 for pressing, as one group, the leads of each row, are integrally formed at two or four peripheral sides of the pressure member 19, and the second contacts 17 are fixedly secured to these lead pressure pads 22. The second contacts 17 are closely attached to the surfaces of the pads in such a manner as to extend from lead pressing surfaces of the pressure pads 22 to outer surfaces thereof. The upper surfaces of the leads 15 are pressed by the contact portions disposed at the lead pressing surfaces of the pressure pads 22 so that the contact portions disposed at the outer surfaces of the pads 22 are brought into contact with third contacts 23.

The above arrangement will be described in more detail with reference to the drawings. The cover member 12 has a window 24 open at a central portion thereof. The lead pressure member 19 is fitted in the window 24 and pivotally supported on an inner wall of the window on the shaft 21. The elastic third contacts 23 are arranged on the inner wall of the window 24 in such a manner as to correspond to the second contacts 17. Elastic contacting elements 23a of the third contacts are provided to extend along the window inner wall surface from above to below from outside to inward. Male terminals 23b extend from basal portions of the elastic contacting elements 23a. These male terminals 23b extend from the upper surface of the cover member 12 and penetrate all the way through the cover member 12 so as to project downward (inward) of the cover member.

On the other hand, the base member 11 is provided at an outer peripheral area of the area outwardly where the first contacts 16 are arranged with male terminals 25 each formed of a spring probe having a contact nose portion elastically expansible in the axial direction. The male terminals 25 penetrate all the way through the base member 11 so as to project downward of the base member. Similarly, male terminals 16c of the first contacts 16 penetrate all the way through the base member 11 so as to project downward of the base member. Projecting ends of the male terminals 25 and 16c are arranged for connection with a wiring board, etc. In other words, the first contacts 16 are arranged for connection with a part such as the wiring board or the like through the male terminals 16c, while the third contacts 23 are arranged for connection to the part through the male terminals 25.

The elastic pressure member 18 is disposed between the adjacent elastic first contacts 16 on the base member in such a manner as to correspond to the second contacts 17. When the first contacts 16 are shifted downward pressed by the leads 15a, the elastic pressure member 18 is shifted downwardly pressed by the leads 15b. Therefore, elastic moduli of the first contacts 16 and elastic pressure member 18 are generally equivalent.

Figure 5:
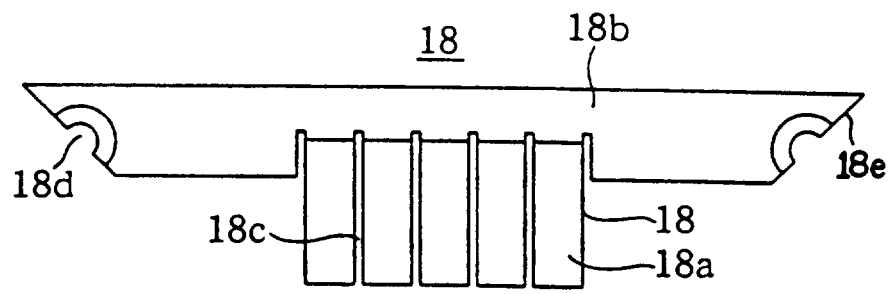
FIG. 5 is a plan view showing one example of an elastic pressure member.
Figure 6:
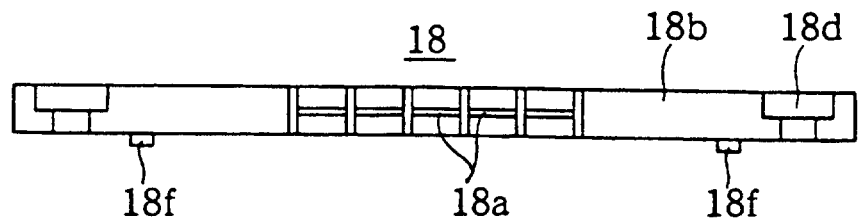
FIG. 6 is a front view of the above.
Figure 7:
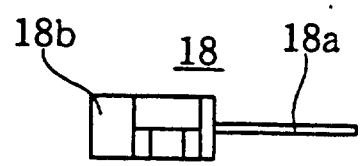
FIG. 7 is a side view of the above.

One specific example of the elastic pressure member 18 will be described with reference to FIGS. 5 through FIG. 8. As one example thereof, as shown in FIGS. 5 through 7, the elastic pressure member 18 is integrally formed such that elastic elements 18a each having a rectangular shape in section, are arranged in parallel, and one ends of the elastic elements 18a are connecting elements 18b, while the other ends thereof are free ends. As shown in FIG. 1, the connecting element 18b is positioned at an outer area of the area where the first contacts 16 are implanted, in such a manner as to be in parallel with the contact rows. The elastic elements 18a extending from one side edge of the connecting element 18b are disposed between adjacent first contacts 16, with the free ends thereof directed toward the mounting section 20 so as to oppose the second contacts 17. Therefore, the elastic elements 18a are arranged in parallel with the second contacts 17 at the same pitches.

The first contacts 16 are arranged within grooves 18c formed between the adjacent elastic elements 18a respectively and electrically mutually isolated by the elastic elements 18a. As a result, the elastic pressure members 18 can be integrally molded from, for example, synthetic resin or rubber. The elastic pressure members 18 are firmly secured to the base member 11 by adhesive. Alternatively, as illustrated, the elastic pressure members 18 are threadedly secured to the base member 11 through mounting holes 18d formed in the connecting element 18b.

In the case where the leads 15a, 15b and the contacts 16, 17 are arranged along four side, as shown in FIG. 7, the connecting elements 18b are provided at both ends thereof with inclined edges 18e of 45° respectively, and each inclined edge 18e is provided with a half-cut mounting hole 18d. As shown in FIG. 1, the connecting elements 18b are disposed on the base member 11 such that the inclined edges 18e of one connecting element 18b are abutted with the inclined edges of the adjacent connecting elements 18b so as to form a framework. Owing to the foregoing arrangement, the half-cut mounting holes 18d form circular shapes, respectively. By using this arrangement, the adjacent connecting elements 18b, 18b can be mounted by a single screw. Each connecting element 18b is provided at an under surface thereof with positioning pins 18f. By inserting these pins 18f into positioning holes formed in the base member 11, a correct mounting position of the elastic pressure member 18 can be obtained.

Figure 8:
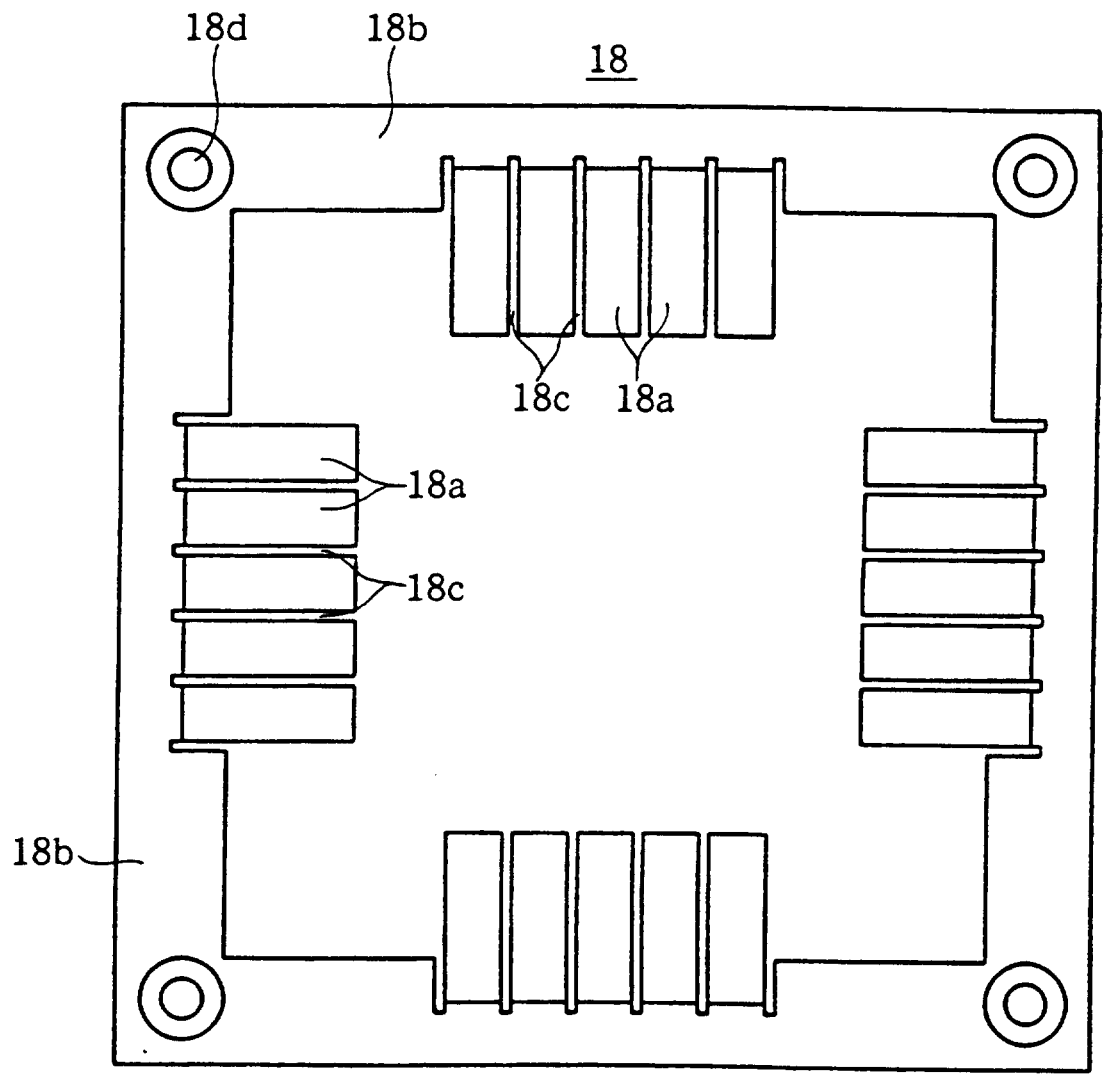
FIG. 8 is a plan view showing another example of an elastic pressure member.

In the example shown in FIG. 8, the connecting elements 18b of the elastic pressure members 18 disposed along each side of the base member 11 are integrally formed in a shape of a framework, with the adjacent connecting elements 18b connected with each other, so that the connecting elements can be mounted on the base member 11 as one unit.

Although not shown, the elastic pressure members 18, in other words, the elastic pads, may be formed of a rubber material, etc. which can be deformed by compression. More specifically, in the example of FIGS. 5 through 8, although the elastic pressure members 18 are formed of the elastic elements 18a which can be shifted by bending, they may be formed of an elastic material such as a rubber material which can be deformed by compression and which has a restoring force, so that the leads are pressed upon the surface of the elastic pressure material to compress the same in order to obtain contact pressure with the second contacts by a reaction thereof.

The present invention may include a case where either a member capable of being shifted by bending or the member capable of being deformed by compression, is employed. The bend-shifting member as well as the compression-deforming member are connected through the connecting element, as shown in FIG. 5, or they may be separate from each other so that they are disposed between adjacent first contacts 16.

Figure 3:
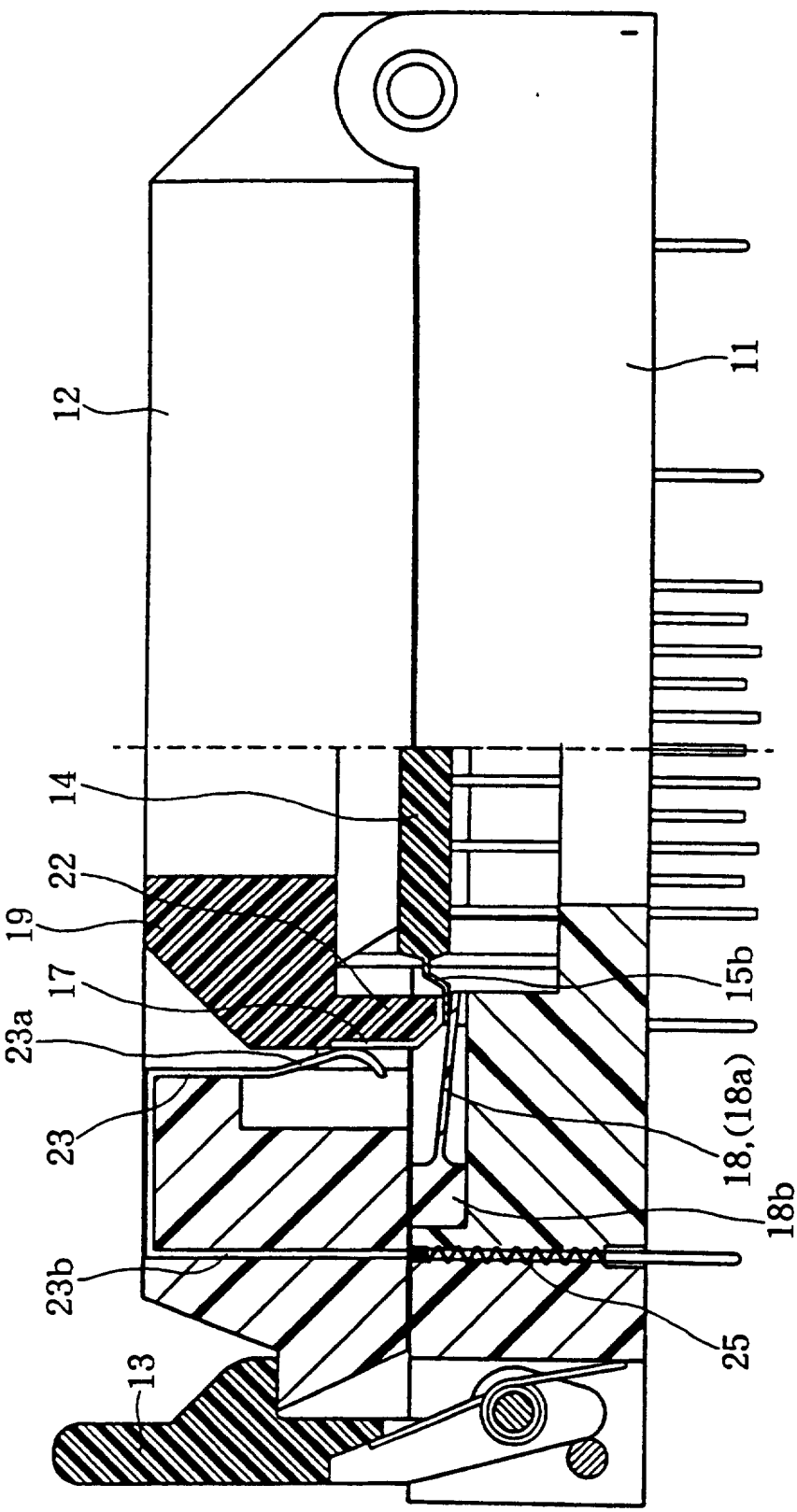
FIG. 3 is an elevation view similar to FIG. 2, showing a state where a cover member thereof is closed.

The operation will be described once again with reference to the drawings. As shown in FIG. 4, when the cover 12 is closed, the pressure pad 22 of the cover 12 pushes down the upper surface of the lead 15a. This causes the elastic contact element 16a of each first contact 16 on which the under surface of the lead 15a is placed, to be shifted downwardly, and contact pressure is obtained by reaction of this contact element 16a. At the same time, owing to the closing of the cover member 12, as shown in FIG. 3, the second contact 17 portion disposed at the pressing surface of the pressure pad 22 pushes down the upper surface of the lead 15b together with the pressing surface. In consequence of that, the elastic pressure member 18 on which the under surface of the lead 15b is placed is elastically shifted downward so as to apply a push-up force to the lead 15b by reaction thereof. This push-up force enables to obtain contact pressure between the second contact 17 and the lead 15b.

Figure 9:
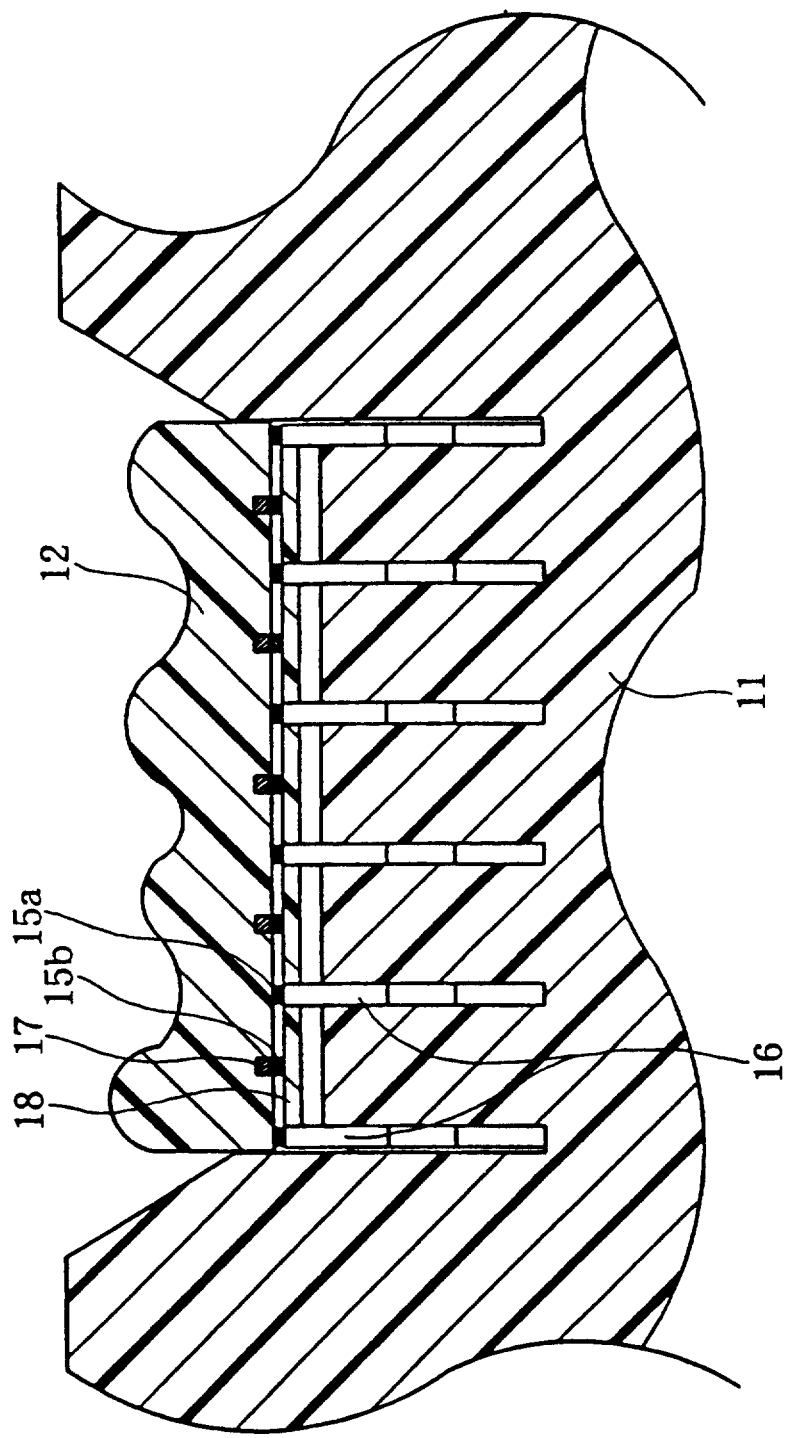
FIG. 9 is a sectional view of an important portion of a connector, showing a state where leads are pressure contacted by first and a second contacts and the elastic member.
Figure 10:
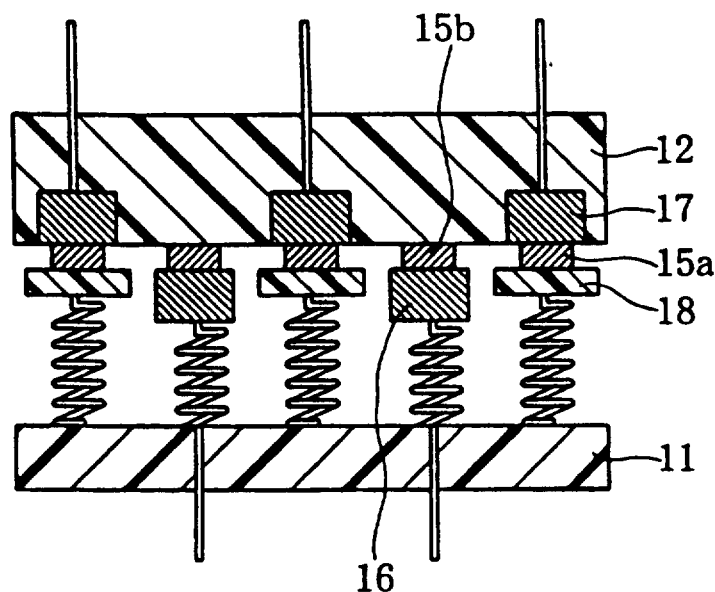
FIG. 10 is a conceptual view (sectional view) for explaining the state of FIG. 9.
Figure 11:
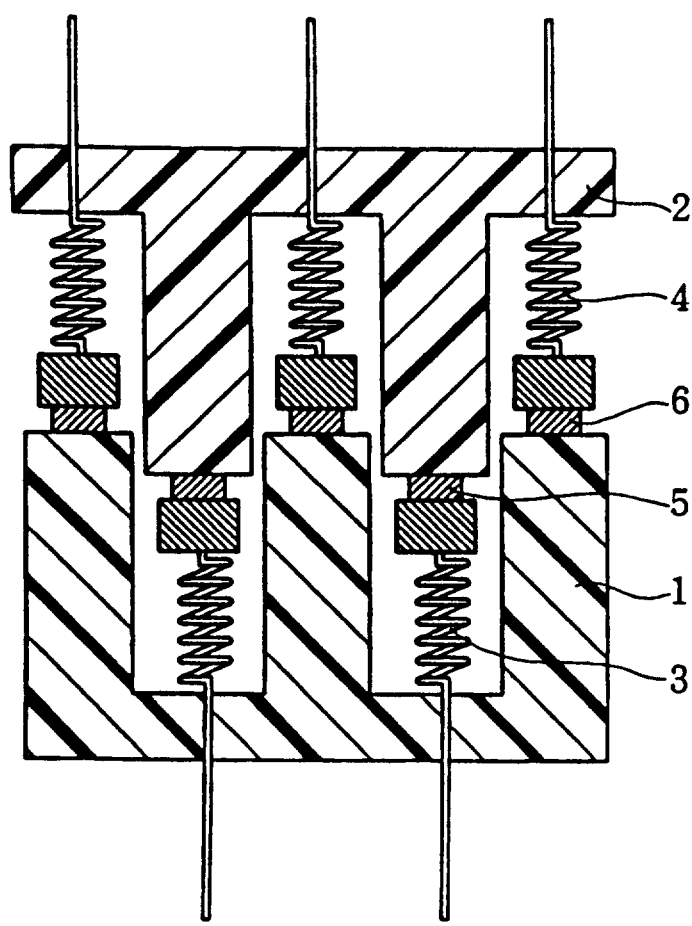
FIG. 11 is a conceptual view (sectional view) of a conventional connector.

As apparent from the foregoing description and also as shown in the conceptual views of FIGS. 9 and 10, all the leads 15a, 15b, while shifting the first contacts 16 and the elastic pressure members 18 disposed therebetween downward, are also lowered in the same direction. Following this movement, the IC body is also lowered. Therefore, the fear of possible harmful permanent deformation of the leads 15a, 15b can be prevented effectively, an orderly arrangement of the leads 15a, 15b can be maintained, and the problems inherent in the prior art in which the leads are vertically irregular and lose flatness are overcome. Even in a case where the IC body does not move in such a manner as to follow the movement of the leads, flatness is obtainable because all the leads are flexed in the same direction.

In the embodiment described above, the base member 11 side is provided with contacts having elastic features, and the elastic pressure members 18 are disposed between adjacent second contacts 17. In a modified embodiment, the present invention may be designed such that the second contacts 17 on the cover member side have the elastic features, and the elastic pressure members 18 are interposed between adjacent second contacts 17, the elastic pressure members 18 being disposed opposite to the first contacts 16.

More specifically, though not shown, the base member 11 is provided with the first contacts 16 capable of contacting the under surfaces of the corresponding leads 15a of the electric part 14, while the cover member 12 to be closed to the base member 11 is provided with second contacts 17 capable of contacting the upper surfaces of the corresponding leads 15b, respectively. The first contacts 16 and second contacts 17 are arranged such that they are brought into contact with mutually different leads of the electric part 14 disposed between the base member 11 and the cover member 12. The second contacts 17 are provided with the elastic features in order to obtain contact pressure against the upper surfaces of the leads 15b. The elastic pressure members 18 corresponding to the first contacts 16 are disposed between adjacent second contacts 17, and by pushing down the upper surfaces of the leads with the elastic pressure members 18, contact pressure of the first contacts 16 against the lower surfaces of the leads 15a are obtained.

As described above, the present invention also includes such a case that the first contacts 16 and the second contacts 17 are alternately arranged at intervals of a plurality of contacts, and for example, a plurality of first contacts 16 and a plurality of elastic pressure members 18 are alternately arranged, and the pressure members 18 are disposed opposite to the second contacts 17. A reverse mode to the foregoing is also included in this invention. The present invention is not limited only to a case where the contacts to be pushed against the elastic pressure members is not provided with the elastic features at all.

What is claimed is:

1. A connector comprising a base member provided with a plurality of first contacts adapted to be contacted with under surfaces of corresponding ones of leads of an electric part, and a cover member to be closed onto said base member, provided with plurality of second contacts adapted to be contacted with upper surfaces of corresponding others of said leads, said first and second contacts being contacted with mutually different leads of said electric part when said electric part is inserted between said base member and said cover, wherein said first contacts on said base member are provided with elasticity for obtaining contact pressure against the under surfaces of corresponding ones of said leads, an elastic pressure member being disposed between adjacent said first contacts in such a manner as to correspond to said second contacts so that the under surfaces of corresponding others of said leads are pushed up by said elastic pressure member to obtain contact pressure between said second contacts and the upper surfaces of said corresponding others of said leads.

2. A connector as claimed in claim 1, wherein said cover member is vertically pivotably provided with a lead pressure member, adapted to urge said leads against said first contacts on said base member, and said lead pressure member is provided with said second contacts.

3. A connector as claimed in claim 1 or 2, wherein said second contacts on said cover member are capable of being contacted with third contacts on said cover member.

4. A connector comprising a base member provided with a plurality of first contacts adapted to be contacted with under surfaces of corresponding ones of leads of an electric part, and a cover member to be closed onto said base member, provided with a plurality of second contacts adapted to be contacted with upper surfaces of corresponding others of said leads, said first and second contacts being contacted with mutually different leads of said electric part when said electric part is inserted between said base member and said cover, wherein said second contacts are provided with elasticity for obtaining contact pressure against the upper surfaces of said corresponding others of leads, an elastic pressure member being disposed between adjacent said second contacts in such a manner as to correspond to said first contacts so that the upper surfaces of said leads are pushed down by said elastic pressure member to obtain contact pressure between said first contacts and the lower surfaces of said corresponding ones of said leads.

* * * * *